United States Patent
Wakai et al.

[15] 3,694,774

[45] Sept. 26, 1972

[54] EMITTER COUPLED MULTIVIBRATOR WITH MEANS FOR PREVENTING GENERATION OF HIGH FREQUENCY NOISE

[72] Inventors: Shuzo Wakai, Kyoto; Mitsuo Nabae, Takatsuki, both of Japan

[73] Assignee: Matsushita Electronics Corporation, Osaka, Japan

[22] Filed: April 23, 1971

[21] Appl. No.: 136,787

[52] U.S. Cl.........................331/113 R, 178/69.5 TV
[51] Int. Cl.............................................H03k 3/282
[58] Field of Search.....331/113 R, 144; 178/69.5 TV

[56] References Cited

UNITED STATES PATENTS 2,929,030 3/1960 Wier......................331/113 R

*Primary Examiner*—Roy Lake
*Assistant Examiner*—Siegfried H. Grimm
*Attorney*—Stevens, Davis, Miller & Mosher

[57] ABSTRACT

A multivibrator circuit comprising two transistors and a capacitor connected across the collector and base of one of the transistors. The said capacitor serves to extend the time required for the reversal of current into a capacitor determining the oscillation frequency of the multivibrator to thereby prevent the generation of high frequency noise.

1 Claim, 2 Drawing Figures

S. WAKAI
AND
M. NABAE
INVENTOR

BY
ATTORNEYS

EMITTER COUPLED MULTIVIBRATOR WITH MEANS FOR PREVENTING GENERATION OF HIGH FREQUENCY NOISE

This invention relates to multivibrator circuits and more particularly to multivibrator circuits provided with means to prevent generation of high frequency noise.

As is well known in the art, the oscillation of the multivibrator circuits is not sinusoidal, but is of the switching type.

Figure 1:
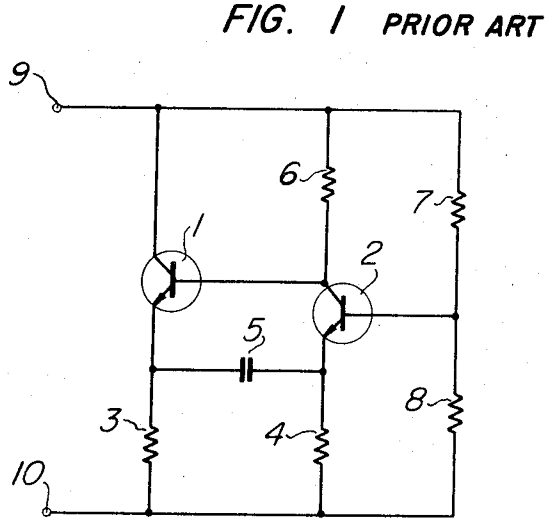
FIG. 1 PRIOR ART
FIG. 1 is a circuit diagram of a conventional multivibrator circuit.

Referring to FIG. 1, reference numerals 1 and 2 designate transistors, numerals 3 and 4 resistors, numeral 5 a capacitor, the resistors 3 and 4 and capacitor 5 determining the oscillation frequency, numeral 6 a resistor for biasing the collector of the transistor 2, numerals 7 and 8 resistors constituting a voltage divider to supply a base bias to the transistor 2, and numerals 9 and 10 terminals across which a d-c voltage is impressed.

In the multivibrator circuit of the above construction, the frequency of the on-off oscillation of the transistors 1 and 2 is determined by the time constant for the circuit of resistors 3 and 4 and capacitor 5, the voltage impressed across the terminals 9 and 10 and the base bias voltage.

This multivibrator circuit finds use as a horizontal oscillator for television and ensures reliable horizontal oscillation. However, since current through the transistors 1 and 2 is switched sharply on-off at a rate corresponding to the oscillation frequency, high frequency noise is generated from leads at various parts of the circuit.

The noise thus generated is usually intercepted by the antenna as UHF radio waves.

Where the electromagnetic field is weak, therefore, the AGC function is lost, increasing the gain of the tuner and intermediate video frequency amplifier. Therefore, the noise is amplified to a greater extent, increasing the signal-to-noise ratio of the video signal. Thus, AGC function sync separation and picture reproduction are adversely affected.

This invention is intended to prevent the generation of noise from the multivibrator circuit, which presents various problems where the multivibrator circuit is used as the horizontal oscillator for television.

The feature of this invention resides in that a capacitor is connected across the collector and base of one of the transistors, which has its collector connected to a collector bias resistor, in the multivibrator circuit.

Figure 2:
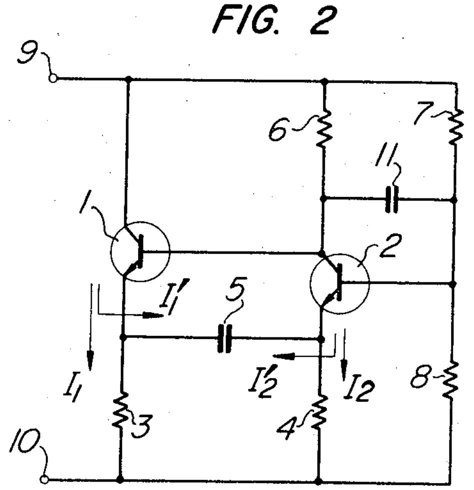
FIG. 2 is a circuit diagram of an embodiment of the multivibrator circuit according to this invention.

FIG. 2 shows an embodiment of the multivibrator circuit according to this invention. Referring to FIG. 2, a capacitor 11 is connected across the collector and base of the transistor 2. The capacitor 11 connected in this manner prevents the generation of high frequency noise, as is described hereinafter.

When the transistor 1 is switched from the conduction state into the cut-off state, the transistor 2 is triggered. The transistor 1 carries an emitter current $I_1 + I'_1$, which is the sum of a current $I_1$ to the resistor 3 and a current $I'_1$ to the capacitor 5.

The current $I'_1$ to the capacitor 5 attenuates exponentially according to the time constant given as the product of the capacitance value of the capacitor 5 and the resistance value of the resistor 4. With the attenuation of the current $I'_1$ the emitter potential of the transistor 2 is progressively reduced.

The switching of the transistor 2 into conduction and that of the transistor 1 into cut-off occur when the emitter potential of the transistor 2 gets lower than a fixed base bias voltage thereon by an amount corresponding to the forward base-emitter voltage drop ($V_{BE}$) thereacross.

At this time, $I'_1$ is sharply reduced to zero, causing a reverse current $I'_2$ to flow into the capacitor 5. Also, the current $I_1$ is reduced to zero and a current $I_2$ is caused to pass across the resistor 4.

It will be seen that upon the above switching of the transistors 1 and 2 the direction of current flowing into the capacitor 5 is reversed.

This current reversal takes place very quickly, resulting in the generation of many high frequency noise waves in the conventional multivibrator circuit where no means is provided to reduce the speed of this current reversal. In the multivibrator circuit according to this invention, the current reversal speed is reduced by virtue of the presence of the capacitor 11.

In the multivibrator circuit according to this invention, when the transistor 1 switches itself from the conduction state into the non-conduction state the collector potential on the transistor 2 (i.e., the base potential of the transistor 1) decreases while causing the discharging of the capacitor 11, so that the rate of potential decrease is slow compared to the conventional multivibrator circuit.

In other words, what is called the temporary discharging current from the capacitor 11 constitutes a base current to the transistor 1, thus reducing the rate of attenuation of the current $I'_1$ into the capacitor 5.

Also, the base current to the base of the transistor 2 for causing the switching thereof from the non-conduction state into the conduction state is temporarily bypassed to the capacitor 11 in the form of negative discharging thereof, thus delaying the triggering of the transistor 2 to delay the initiation of the currents $I_2$ and $I'_2$.

In the above manner, the speed of reversal of direction of current into the capacitor 5 is reduced to prevent the generation of high frequency noise.

At the time of switching of the transistor 2 from the conduction state into the non-conduction state and the transistor 1 from the non-conduction state into the conduction state, the capacitor 11 also functions effectively.

Part of the base current to the transistor 1 for causing the switching thereof from the non-conduction state into the conduction state is temporarily bypassed to charge the capacitor 11. With the temporary reduction of the base current, the current switching by the transistor 1 is delayed.

Also, current by negative charging of the capacitor 11 or discharging current therefrom constitutes the base current to the transistor 1 in the course of switching of the transistor 2 from the conduction state into the non-conduction state, thus delaying the cutting-off of the transistor to delay the current switching.

As a consequence, the current reversal is reduced, that is, the time required for the switching of currents $I_1$ and $I_2$ and the switching of currents $I'_1$ and $I'_2$ is extended to prevent the generation of high frequency noise.

As has been made apparent from the foregoing, according to this invention it is possible to prevent the generation of high frequency noise in the multivibrator circuit by the addition of a single capacitor without appreciably complicating the circuit construction.

Since the multivibrator circuit according to this invention is free from the generation of high frequency noise, there is no possibility of losing the AGC function when it is employed as a horizontal oscillator for television, eliminating any undesired effect of the AGC function, sync separation and picture reproduction.

What is claimed is:

1. A multivibrator circuit comprising a first transistor having the collector thereof connected through a collector bias resistor to a main power source terminal and the emitter thereof connected through an emitter bias resistor to ground, a voltage divider to supply a base bias voltage to said first transistor, said voltage divider being connected between said main power source terminal and ground, a second transistor having the base thereof connected to the collector of said first transistor, the collector thereof connected directly to said main power source terminal, and the emitter thereof connected through an emitter bias resistor to ground, a capacitor connected between the emitters of said first and second transistors, and a capacitor connected across the collector and base of said first transistor.

* * * * *